United States Patent
Yang et al.

(10) Patent No.: US 6,822,335 B2
(45) Date of Patent: Nov. 23, 2004

(54) METHOD FOR ARRANGING WIRING LINE INCLUDING POWER REINFORCING LINE AND SEMICONDUCTOR DEVICE HAVING POWER REINFORCING LINE

(75) Inventors: Won-suk Yang, Kyunggi-do (KR); Jae-young Lee, Kyunggi-do (KR); Chang-hyun Cho, Kyunggi-do (KR); Ki-nam Kim, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/452,096

(22) Filed: May 30, 2003

(65) Prior Publication Data

US 2003/0211722 A1 Nov. 13, 2003

Related U.S. Application Data

(62) Division of application No. 09/995,496, filed on Nov. 26, 2001, now Pat. No. 6,596,626.

(30) Foreign Application Priority Data

Feb. 3, 2001 (KR) .......................................... 2001-5259

(51) Int. Cl.$^7$ ................................................ H01L 21/31
(52) U.S. Cl. ....................................... 257/776; 365/63
(58) Field of Search ................................ 257/208, 210, 257/211, 372, 758, 776; 438/622; 365/63, 164, 174, 214

(56) References Cited

U.S. PATENT DOCUMENTS

| | | | |
|---|---|---|---|
| 5,930,166 A | 7/1999 | Jeon ............................ | 365/274 |
| 6,034,879 A | 3/2000 | Min et al. ..................... | 365/63 |
| 6,222,275 B1 * | 4/2001 | Keeth .......................... | 257/776 |
| 6,429,529 B1 * | 8/2002 | Keeth .......................... | 257/776 |

FOREIGN PATENT DOCUMENTS

JP        2000323672        11/2001

OTHER PUBLICATIONS

Hidaka, et al., "Twisted Bit–Line Architectures for Multi–Megabit DRAM's"; *IEEE Journal of Solid–State Circuits*, vol. 24, No. 1, Feb. 1989; (pp. 21–27).
Aoki, et al., "A 60–ns 16–Mbit CMOS DRAM with a Transposed Date–Line Structure"; *IEEE Journal of Solid–State Circuits*, vol. 23, No. 5, Oct. 1988; (pp. 1113–1119).
Kirihata, et al., "A 390–mm$^2$, 16–Bank, 1Gb DDR SDRAM with Hybrid Bitline Architecture"; *IEEE Journal of Solid–State Circuits*, vol. 34, No. 11, Nov. 1999, (pp. 1580–1588).
English Translation of Japanese Abstract Patent No. JP2000323672.

* cited by examiner

*Primary Examiner*—David Nelms
*Assistant Examiner*—David Vu
(74) *Attorney, Agent, or Firm*—Marger Johnson & McCollom, P.C.

(57) ABSTRACT

A method for arranging a power supply line in a semiconductor device including a plurality of memory cell array blocks and a semiconductor device are provided in order to supply stable operating voltages, such as a power supply voltage and a ground voltage, to a sense amplifier allocated to each of the plurality of memory cell array blocks. The method includes the steps of arranging a plurality of first interconnections that extend in one direction and are spaced apart from one another on a semiconductor substrate on which the plurality of memory cell array blocks are formed, forming a first insulating layer on the plurality of first interconnections, arranging a plurality of power reinforcing lines that extends in one direction and are spaced apart from one another on the plurality of first interconnections on the first insulating layer, forming a second insulating layer on the plurality of power reinforcing lines, and arranging a plurality of second interconnections that intersect the plurality of first interconnections and the plurality of power reinforcing lines on the second insulating layer. The plurality of second interconnections include a first group and a second group, and the second interconnections in the second group are electrically connected to the plurality of power reinforcing lines on the plurality of memory cell array blocks via contact plugs formed in the second insulating layer.

7 Claims, 3 Drawing Sheets

METHOD FOR ARRANGING WIRING LINE INCLUDING POWER REINFORCING LINE AND SEMICONDUCTOR DEVICE HAVING POWER REINFORCING LINE

This application is a divisional of U.S. patent application Ser. No. 09/995,496 now U.S. Pat. No. 6,596,626, filed on Nov. 26, 2001, which is herein incorporated by reference in it's entirety.

BACKGROUND OF THE INVENTION

1. Field of the Invention

The present invention relates to a method for arranging power supply lines in a semiconductor device, and more particularly, to a method for arranging a power reinforcing line for uniformly and supplying a stable power supply voltage, a ground voltage, and a boosting voltage to a sense amplifier of a semiconductor device.

2. Description of the Related Art

As semiconductor devices become highly integrated, the design rule and chip sizes are reduced. On the other hand, it becomes necessary to suppress signal delay in RC circuits and supply power with stability. In order to meet these needs, a technology has been developed to increase the width of a metal layer (interconnections) that comprises a power supply line for supplying power to a semiconductor device. In a dynamic random access memory (DRAM) of 64M or more, the metal layer of a double layer excluding word lines and bit lines, has been used as a power supply line by using the metal layer of a double layer as an interconnection. However, for a DRAM of 1 gigabyte, it is difficult to supply stable power to the device by using only the metal layer of a double layer. The problem will be described further with reference to FIG. 1.

A plurality of DRAM memory cells (not shown) having a matrix arrangement are included in each of the plurality of memory cell array blocks 10. Sub-word line drivers 18 are arranged adjacent to the memory cell array blocks 10 in the direction to which word lines (not shown) are extended, and sense amplifiers 16 are arranged adjacent to the memory cell array blocks 10 in the direction to which bit lines (not shown) are extended. The sense amplifiers 16 are connected to column decoders 12 arranged parallel to the sense amplifiers 16, and the sub-word line drivers 18 are connected to row decoders 14 arranged parallel to the sub-word line drivers 18. A normal word line enabling signal (not shown) output from one of the row decoders 14 is supplied via first interconnections 20 to the sub-word line drivers 18 located along the same rows as the above row decoder 14. A column selection signal (not shown) output from one of the column decoders 12 is supplied via a first group 22a of the second interconnections 22 to the sense amplifiers 16 located along the same columns as the above column decoder 12. Operating voltages, such as a power supply voltage, a ground voltage, and a boosting voltage, are supplied to the sense amplifiers 16 via a second group 22b of the second interconnections 22.

When a predetermined normal word line enabling signal is selected, a neighboring first interconnection 20, one of the first interconnections 20 used for transmitting the selected signal is affected by coupling noise or parasitic capacitance. Also, when the selected normal word line enabling signal is transmitted from the closest first sub-word line driver 18 arranged closely to the low decoder 14 to the furthest sub-word line driver 18 from the low decoder 14, a signal delay inevitably occurs. In order to reduce the signal delay, the width of the first interconnections 20 for transmitting the normal word line enabling signal NWEi is increased. However, this causes an interval between the first interconnections 20 to become narrower and coupling noise or parasitic capacitance to increase.

As a result, a technology for forming second interconnections 22 having a second group 22b on the sense amplifiers 16 arranged between the memory cell array blocks 10 has been suggested. However, since a power supply line is formed on the sense amplifiers 16 occupying a narrow region, the power supply line is arranged at narrow intervals. Thus, noise is caused by the power supply line, and it is difficult to obtain a margin in a process of forming contact plug for connecting the power supply line to the sense amplifiers 16.

Further, since the number of the sense amplifiers 16 is increased by the abovementioned two technologies according to an increase in density, as the power required for operation, such as the power supply voltage is transmitted, the power is consumed. Thus, it is difficult to maintain operating voltages in the sense amplifiers 16.

SUMMARY OF THE INVENTION

To solve the above problems, it is a first objective of the present invention to provide a method for arranging a power supply line for the purpose of supplying stable power to a sense amplifier in a semiconductor device.

It is a second objective of the present invention to provide a semiconductor device having a power supply line capable of supplying stable power to a sense amplifier.

Accordingly, to achieve the first objective, there is provided a method for arranging a power supply line in a semiconductor device including a plurality of memory cell array blocks. In the method, a plurality of first interconnections that extend in one direction and are spaced apart from one another are arranged on a semiconductor substrate on which the plurality of memory cell array blocks are formed. The plurality of first interconnections have a pitch corresponding to two pairs of word lines arranged on each of the plurality of memory cell array blocks. A first insulating layer is formed on the plurality of first interconnections. A plurality of power reinforcing lines that extend in one direction and are spaced apart from one another on the plurality of first interconnections are arranged on the first insulating layer. A second insulating layer is formed on the plurality of power reinforcing lines. A plurality of second interconnections that intersect the plurality of first interconnections and the plurality of power reinforcing lines are arranged on the second insulating layer. The plurality of second interconnections include a first group and a second group, and the second interconnections in the second group are electrically connected to the plurality of power reinforcing lines on the plurality of memory cell array blocks via contact plugs formed in the second insulating layer.

It is preferable that each of the plurality of power reinforcing lines is allocated to at least two first interconnections, and the pitch of the plurality of power reinforcing lines spans at least four first interconnections. It is also preferable that each of the plurality of power reinforcing lines is bent with respect to the first interconnections and at least four times over a semiconductor device, each of the plurality of power reinforcing lines is bent over a plurality of sub-word line drivers arranged on peripheral regions of the plurality of memory cell array blocks, each of the plurality of power reinforcing lines is connected to one of a plurality of sense amplifiers allocated to each of the plurality of memory cell array blocks via the plurality of second interconnections in the second group, and a normal word line enabling signal is transmitted to one of a plurality of sub-word line drivers allocated to each of the plurality of memory cell array blocks via each of the plurality of first interconnections, and a column selection signal is transmitted to one of the plurality of the sense amplifiers via the plurality of second interconnections in the first group.

In order to achieve the second objective, there is provided a semiconductor device. The device includes a plurality of memory cell array blocks, a plurality of first interconnections that extend in one direction and are spaced apart from one another on a semiconductor substrate on which the plurality of memory cell array blocks are formed, a first insulating layer for insulating the plurality of first interconnections, a plurality of power reinforcing lines that extend in one direction and are spaced apart from one another on the plurality of first interconnections on the first insulating layer, a second insulating layer for insulating the plurality of power reinforcing lines and having contact plugs, and a plurality of second interconnections that intersect the plurality of first interconnections and the plurality of power reinforcing lines on the plurality of power reinforcing lines on the second insulating layer. The plurality of second interconnections include a first group and a second group, and the second interconnections in the second group are electrically connected to the plurality of power reinforcing lines on the plurality of memory cell array blocks via contact plugs formed in the second insulating layer.

It is preferable that each of the plurality of power reinforcing lines is allocated to at least two first interconnections, and the pitch of the plurality of power reinforcing lines spans at least four first interconnections.

It is also preferable that the device further includes a plurality of sub-word line drivers arranged on each of peripheral regions of the plurality of memory cell array blocks, and each of the plurality of power reinforcing lines is bent with respect to the first interconnections on a plurality of sub-word line drivers at least four times over the semiconductor device.

It is also preferable that the device further includes a plurality of sense amplifiers that are arranged adjacent to each of the plurality of power reinforcing lines and are power-reinforced via the plurality of power reinforcing lines and the plurality of second interconnections in the second group.

BRIEF DESCRIPTION OF THE DRAWINGS

The above objectives and advantages of the present invention will become more apparent by describing in detail a preferred embodiment thereof with reference to the attached drawings in which.

DETAILED DESCRIPTION OF THE INVENTION

Figure 1:
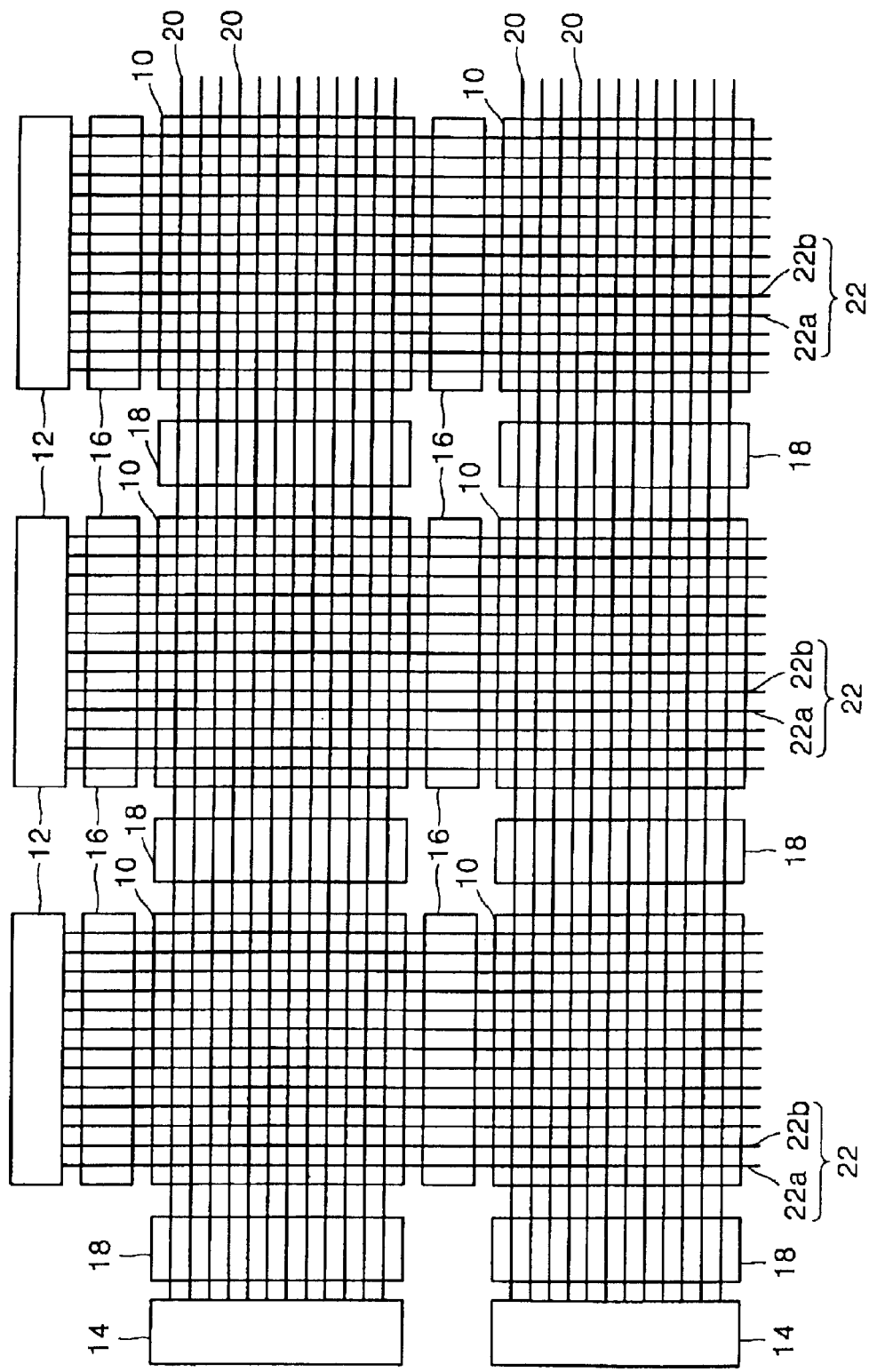
FIG. 1 is a layout diagram of a conventional semiconductor device including double interconnections.
Figure 2:
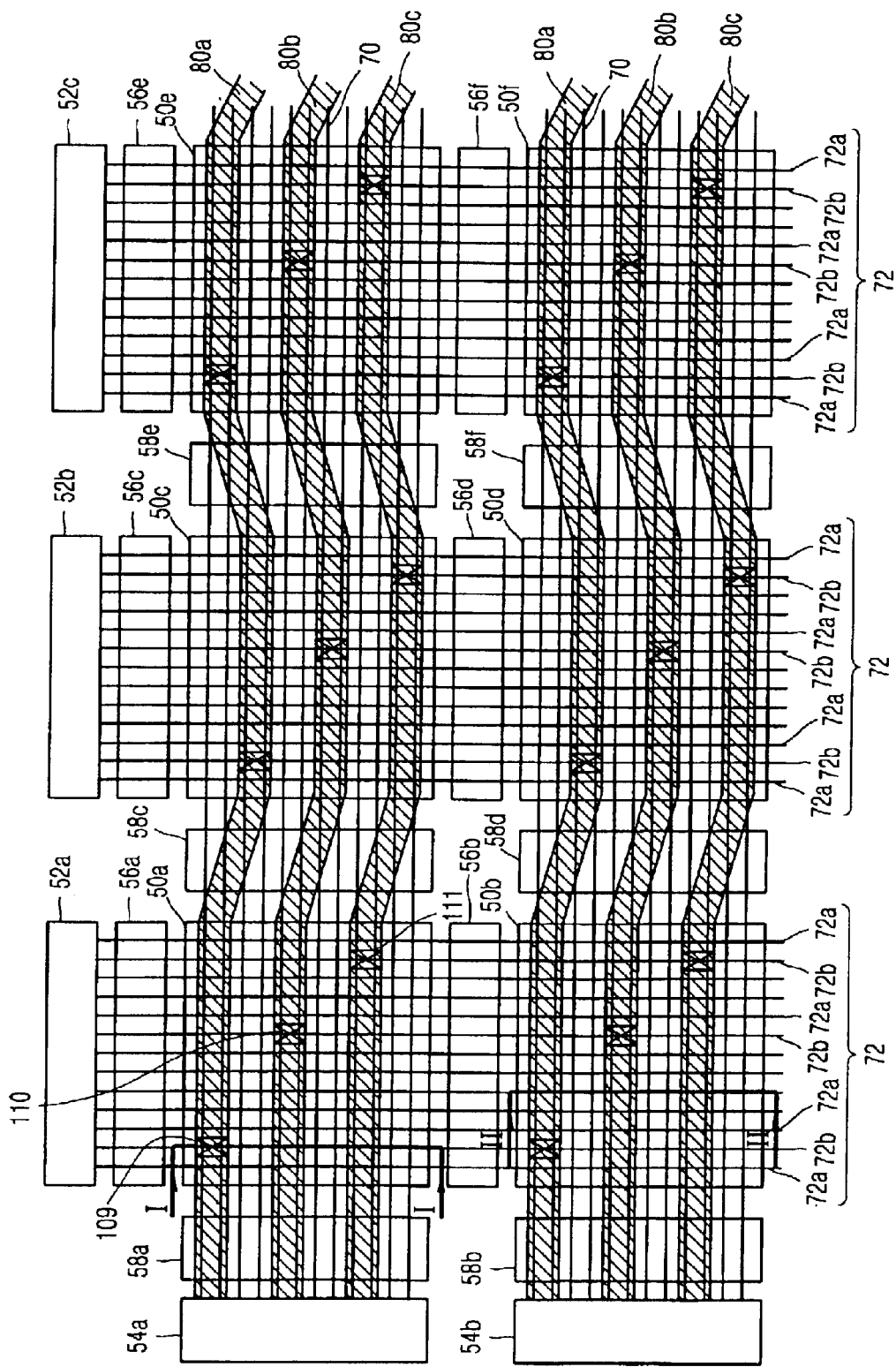
FIG. 2 is a layout diagram of a semiconductor device including power reinforcing lines according to the present invention.
Figure 3:
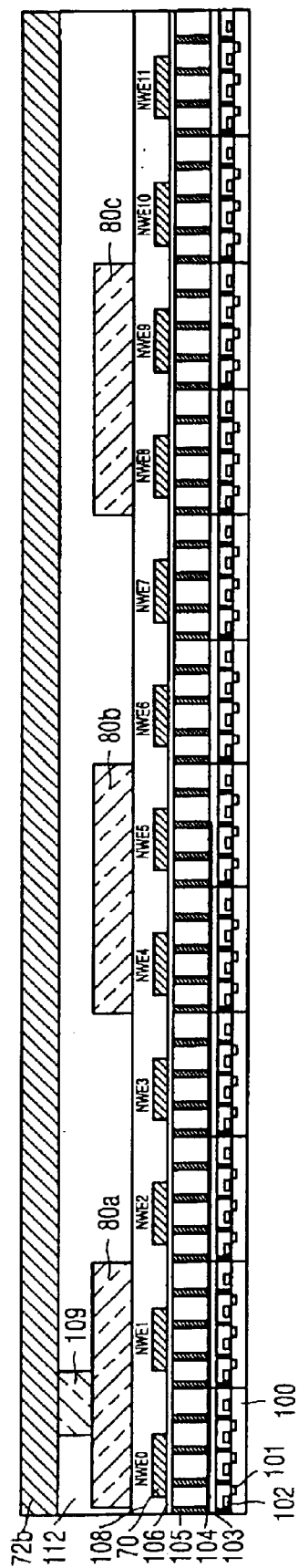
FIG. 3 is a sectional view taken along line I—I of FIG. 2.
Figure 4:
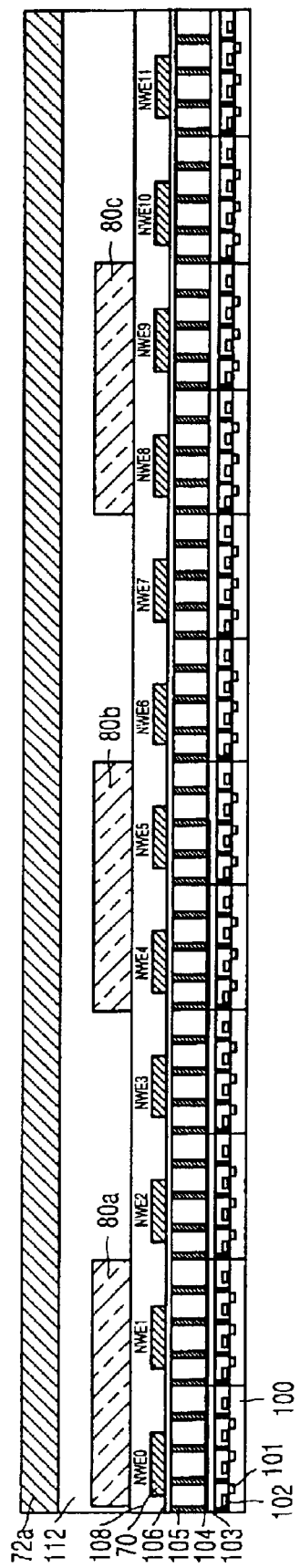
FIG. 4 is a sectional view taken along line II—II of FIG. 2.

Hereinafter, the present invention will be described in greater detail with reference to attached FIGS. 2, 3, and 4.

Memory cell array blocks 50a–50f include a plurality of DRAM memory cells (not shown) arranged in a matrix having columns and rows, a plurality of bit lines (not shown) connected to a memory cell in a column direction, and a plurality of word lines (not shown) connected to a memory cell in a row direction. In general, the memory cell is comprised of one access transistor (not shown) and one capacitor 105. The memory cell can also be comprised of two transistor cells, three transistor cells, or four transistor cells. Sub-word line drivers 58a–58f are arranged in the direction to which word lines are extended, adjacent to the memory cell array blocks 50a–50f, and sense amplifiers 56a–56f are arranged adjacent to the memory cell array blocks 50a–50f in the direction to which bit lines are extended. Row decoders 54a and 54b decode an internal address signal of an address buffer (not shown), thereby generating normal word line enabling signals NWEi, where i is an integer between 0 and 11 for selecting the rows of the memory cell array blocks 50a–50f. The normal word line enabling signals NWEi are transmitted to the sub-word line drivers 58a–58f allocated to each of the memory cell array blocks 50a–50f, via first interconnections 70 formed on an insulating layer 106 above a capacitor 105 formed on a semiconductor substrate 100. Meanwhile, column decoders 52a, 52b, and 52c decode the internal address signal of the address buffer, thereby outputting column selection signals CSLj, where j is an integer between 0 and 11 for selecting the columns of the memory cell array blocks 50a–50f. The column selection signals CSLj are transmitted to the sense amplifiers 56a, 56b, and 56c allocated to each of the memory cell array blocks 50a–50f via a first group 72a of second interconnections 72 having a strap-like arrangement. Also, operating voltages, such as a power supply voltage, a ground voltage, and a boosting voltage are supplied to the sense amplifiers 56a, 56b, and 56c via a second group 72b of second interconnections 72. Here, one of the first interconnections 70 is allocated to four word lines, and one of the second interconnections 72 in the first group 72a for transmitting column selection signals is allocated to eight bit lines. The first interconnections 70 and the second interconnections 72 are formed of metal, such as aluminum.

Power reinforcing lines 80a–80c, which are extended in the same direction to which the first interconnections 70 are extended, are interposed in a layer between the first interconnections 70 and the second interconnections 72. Here, the power reinforcing lines 80a–80c are separated from the first interconnections 70 and the second interconnections 72 by insulating layers 108 and 110, respectively. The power reinforcing lines 80a–80c are extended in the direction to which the first interconnections 70 are extended and consequently, intersect the bit lines. Thus, sensing ability of the sense amplifiers 56a–56f are suppressed by parasitic capacitance occurring between the bit lines and the power reinforcing lines 80a–80c. Of the second interconnections 72, the second group 72b is formed on the insulating layer 106 on the same plane as the first group 72a for transmitting the column selection signals CSLj. Only the power reinforcing lines 80a–80c are formed on the insulating layer 108. The width of the power reinforcing lines 80a–80c can be increased more than the width of the second interconnections 72 in the second group 72b, and thus, power consumption can be reduced when reinforcing power via the power reinforcing lines 80a–80c. Since second interconnections 72 in the second group 72b are interspersed between second interconnections 72 in the first group 72a for transmitting the column selection signals CSL and are connected to the power reinforcing lines 80a–80c via contact plugs 109, 110, and 111, and the number of second interconnections 72 in the first group 72a that are not connected to the contact plugs 109, 110, and 111 is larger than the number of interconnections 72 in the second group 72b that are connected to the contact plugs 109, 110, and 11.

The power reinforcing lines 80a–80c are connected by the contact plugs 109, 110, and 111 formed in the insulating layer 112 to the second interconnections 72 in the second group 72b for supplying power and the memory cell array blocks 50a–50f. For efficient power reinforcement, the position where a contact plug is formed can be selected. For example, since the position of the contact plug 109 that is connected to the power reinforcing line 80a formed on top of the memory cell array block 50a is closer to the sense amplifier 56a arranged above the memory cell array block 50a than to the sense amplifier 56b arranged below the memory cell array block 50a, power supplied via the power reinforcing line 80a and the contact plug 109 is transmitted to the sense amplifier 56a via the second group 72b of the second interconnections 72. Also, the contact plug 111 that is connected to the power reinforcing line 80c supplies power to the sense amplifier 56b arranged below the memory cell array block 50a via the second interconnections 72 in the second group 72b. Stable power can be supplied to the sense amplifier 56b arranged below the memory cell array block 50a and the sense amplifier 56a arranged above the memory cell array block 50a via the contact plug 110 formed in the middle of the memory cell array block 50a, the second interconnections 72 in the second group 72b, and the power supply line 80b.

Each of the power reinforcing lines 80a–80c is allocated to two first interconnections 70 for transmitting the normal word line enabling signals NWEi, and the pitch of each of the power reinforcing lines 80a–80c corresponds to four first interconnections 70. Here, the pitch of the power reinforcing lines 80a–80c and the number of first interconnections 70 spanned by the power reinforcing lines 80a–80c are not be construed as being limited to the example. Thus, the power reinforcing lines 80a–80c on the memory cell array block 50a are formed on the first interconnections 70 for transmitting the first and second normal word line enabling signals NWE0 and NWE1, the fifth and sixth normal word line enabling signals NWE4 and NWE5, and the ninth and tenth normal word line enabling signals NWE8 and NWE9, but not for transmitting the third and fourth normal word line enabling signals NWE2 and NWE3, the seventh and eighth normal word line enabling signals NWE6 and NWE7, and the eleventh and twelfth normal word line enabling signals NWE10 and NWE11.

Since the parasitic capacitance between the first interconnections 70 and the power reinforcing line 80a varies according to the position of parasitic capacitance, delay times of the normal word line enabling signals varies according to the existence of the power reinforcing line 80a. In order to reduce signal delays, the power reinforcing lines 80a–80c are bent over the sub-word line drivers 58a–58f arranged between the memory cell array blocks 50a–50f. That is, if the power reinforcing lines 80a–80c arranged on the first interconnections transmit the first and second normal word line enabling signals NWE0 and NWE1 in the memory cell array blocks 50a and 50b arranged in a first column, the power reinforcing lines 80a–80c arranged on the first interconnections for transmitting the first and second normal word line enabling signals NWE0 and NWE1 in the memory cell array blocks 50c and 50d arranged in a second column. This step is repeated for the entired semiconductor device. However, the number of bends is not limited to one for each of the memory cell array blocks 50a–50f. Preferably, there are at least four bends over the entire semiconductor device, as shown in FIG. 2.

Unexplained reference numerals 101, 102, 103, and 104 denote a device isolation region, a gate electrode, an insulating layer, and an etch stopper, respectively.

According to the present invention, since power supplied to the sense amplifiers 56a–56f is reinforced via the power reinforcing lines 80a–80c connected to the contact plugs 109, 110, and 111, stable power can be supplied to the sense amplifiers 56a–56f. Also, the contact plugs 109, 110, and 111 are formed on the memory cell array blocks having an area wider than the sense amplifiers, and the power reinforcing lines 80a–80c are formed on a different plane from the second interconnections 72 for supplying the column selection signals CSLj and power, thereby forming wider power reinforcing lines 80a–80c. Accordingly, the margin in a process of forming the contact plugs 109, 110, and 111 for connecting the second interconnection 72 in the second group 72b to the power reinforcing lines 80a–80c can be obtained, and power consumption caused by the power reinforcing lines 80a–80c can be suppressed.

What is claimed is:

1. A semiconductor device comprising:
   a plurality of memory cell array blocks;
   a plurality of first interconnections that extend in one direction and are spaced apart from one another on a semiconductor substrate on which the plurality of memory cell array blocks are formed;
   a first insulating layer for insulating the plurality of first interconnections;
   a plurality of power reinforcing lines that extend in one direction and are spaced apart from one another on the plurality of first interconnections on the first insulating layer,
   a second insulating layer for insulating the plurality of power reinforcing lines and having contact plugs; and
   a plurality of second interconnections that intersect the plurality of first interconnections and the plurality of power reinforcing lines on the second insulating layer,
   wherein the plurality of second interconnections include a first group and a second group, and the second interconnections in the second group are electrically connected to the plurality of power reinforcing lines on the plurality of memory cell array blocks via contact plugs formed in the second insulating layer.

2. The device of claim 1, wherein each of the plurality of power reinforcing lines is allocated to at least two first interconnections.

3. The device of claim 2, wherein the pitch of the plurality of power reinforcing lines spans at least four first interconnections.

4. The device of claim 1, further comprising a plurality of sub-word line drivers arranged on each of peripheral regions of the plurality of memory cell array blocks.

5. The device of claim 4, wherein each of the plurality of power reinforcing lines is bent with respect to the first interconnections on a plurality of sub-word line drivers at least four times over the semiconductor device.

6. The device of claim 1 further comprising a plurality of sense amplifiers that are arranged adjacent to each of the plurality of power reinforcing lines and are power-reinforced via the plurality of power reinforcing lines and the plurality of second interconnections in the second group.

7. A semiconductor device comprising:
   a plurality of memory cell array blocks on a semiconductor substrate;

a plurality of first interconnections spaced apart from one another on the semiconductor substrate;

a first insulating layer to insulate the plurality of first interconnections;

a plurality of power reinforcing lines spaced apart from one another on the first insulating layer;

a second insulating layer to insulate the plurality of power reinforcing lines and having contact plugs; and a plurality of second interconnections having a first group and a second group, intersecting the plurality of first interconnections and the plurality of power reinforcing lines on the second insulating layer, wherein the second group are electrically connected to the plurality of power reinforcing lines via the contact plugs.

* * * * *

UNITED STATES PATENT AND TRADEMARK OFFICE
CERTIFICATE OF CORRECTION

PATENT NO. : 6,822,335 B2
DATED : November 23, 2004
INVENTOR(S) : Yang et al.

It is certified that error appears in the above-identified patent and that said Letters Patent is hereby corrected as shown below:

Column 5,
Line 5, replace "plugs 109, 110, and 11." with -- plugs 109, 110, and 111. --.

Signed and Sealed this

Seventeenth Day of January, 2006

JON W. DUDAS
*Director of the United States Patent and Trademark Office*